United States Patent
Wei (10) Patent No.: US 11,067,673 B2
(45) Date of Patent: Jul. 20, 2021

(54) SENSOR, APPARATUS FOR LIDAR APPLICATION AND METHOD OF BACKGROUND CANCELLATION

(71) Applicant: CMOS Sensor, Inc., Cupertino, CA (US)

(72) Inventor: Hui Wei, San Jose, CA (US)

(73) Assignee: CMOS Sensor, Inc., Cupertino, CA (US)

( * ) Notice: Subject to any disclaimer, the term of this patent is extended or adjusted under 35 U.S.C. 154(b) by 448 days.

(21) Appl. No.: 15/981,926

(22) Filed: May 17, 2018

(65) Prior Publication Data

US 2019/0353786 A1 Nov. 21, 2019

(51) Int. Cl.
| G01S 7/48 | (2006.01) |
| G01S 7/4863 | (2020.01) |
| G01S 17/10 | (2020.01) |
| H01L 27/146 | (2006.01) |
| H01L 25/16 | (2006.01) |
| G01S 17/894 | (2020.01) |

(52) U.S. Cl.
CPC ............ *G01S 7/4863* (2013.01); *G01S 17/10* (2013.01); *G01S 17/894* (2020.01); *H01L 25/167* (2013.01); *H01L 27/14643* (2013.01)

(58) Field of Classification Search
CPC ........... H04N 13/0007; H04N 13/0253; H04N 13/0239; H04N 5/3535; H04N 5/378; H04N 2013/0092; G06T 7/0057; G06T 5/50; G06T 5/001; G06T 2207/10152; G06T 2207/10028; G06T 2207/10144; H01L 27/14643; H01L 27/14614
See application file for complete search history.

(56) References Cited

U.S. PATENT DOCUMENTS

| 6,810,135 | B1 * | 10/2004 | Berenz | G06K 9/00248 |
| | | | | 280/735 |
| 7,286,174 | B1 * | 10/2007 | Weale | H04N 5/335 |
| | | | | 250/208.1 |
| 8,642,938 | B2 * | 2/2014 | Bikumandla | G01S 7/4863 |
| | | | | 250/208.1 |
| 2012/0274744 | A1 * | 11/2012 | Wan | G01S 17/10 |
| | | | | 348/46 |
| 2013/0020471 | A1 * | 1/2013 | Korekado | H03M 1/123 |
| | | | | 250/208.1 |
| 2018/0124372 | A1 * | 5/2018 | Yang | H01L 27/14643 |
| 2020/0124726 | A1 * | 4/2020 | Geuens | G01S 7/4865 |

* cited by examiner

*Primary Examiner* — Luke D Ratcliffe
(74) *Attorney, Agent, or Firm* — Joe Zheng (57) ABSTRACT

Techniques of designing an image sensor particularly useful in lidar applications are described. According to one aspect of the present invention, an image sensor is designed to take advantage of the architecture of CMOS sensor with correlated double sampling, or CDS, to avoid the sensing speed being halved in order to cancel background light interference. It is commonly known that a photosensor is read twice (i.e., first and second readouts) in CDS for removing the inherent noises from the photosensor itself. Instead of subtracting a pixel's dark or reference output level from an actual light-induced signal, a background image is managed to be captured before the second readout of the sensor and subtracted from an actual image, where the actual image is defined to include an target. As a result, the readout speed of an image sensor is maintained while the background light interference is removed.

19 Claims, 9 Drawing Sheets

Prior art

Prior art

310 — Photodiode (sensor or pixel element) → 304 — Support circuit

SENSOR, APPARATUS FOR LIDAR APPLICATION AND METHOD OF BACKGROUND CANCELLATION

BACKGROUND OF THE INVENTION

1. Field of the Invention

The present invention is related to the area of ambient detection and scanning. More particularly, the present invention is related to image sensors with background cancellation capability for lidar applications.

2. Description of Related Art

Lidar (also called LIDAR, LiDAR, and LADAR) is a surveying method that measures distance to a target by illuminating the target with dot pulsed laser light and measuring the reflected pulses with a sensor. Differences in locations (or response) of the dot laser returns on the sensor and then be used to make digital 3-D representations of the target. The name lidar, now used as an acronym of light detection and ranging (sometimes light imaging, detection, and ranging), was originally a portmanteau of light and radar. Lidar sometimes is also called laser scanning and laser depth sensor scanning with terrestrial, airborne, and mobile applications.

Figure 1A:
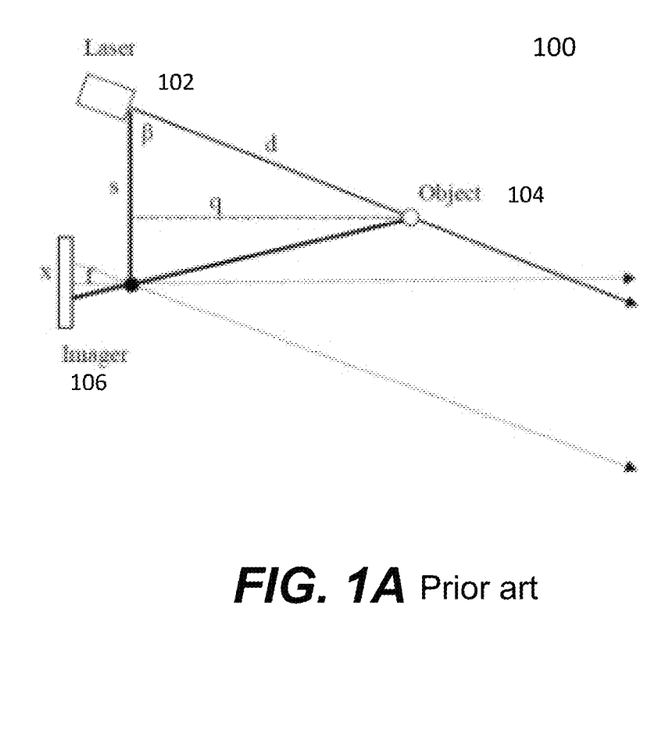
FIG. 1A illustrates a configuration of using a laser and an imager to detect a distance d between the laser and an object being impinged upon by the laser, all based on triangulation.

Lidar uses ultraviolet, visible, or near infrared light to image objects. It can target a wide range of materials. FIG. 1A illustrates a configuration 100 of using a laser and an imager to detect a distance d between the laser and an object being projected with a laser, all based on triangulation. In operation, an activated dot laser 102 is provided to light the object 104. A sensor 106 is provided to detect the lighted dot or reflection on the object. Based on the preconfigured geometry of the laser 102 and the imager 106, the distance q can be derived based on triangulation.

Figure 1B:
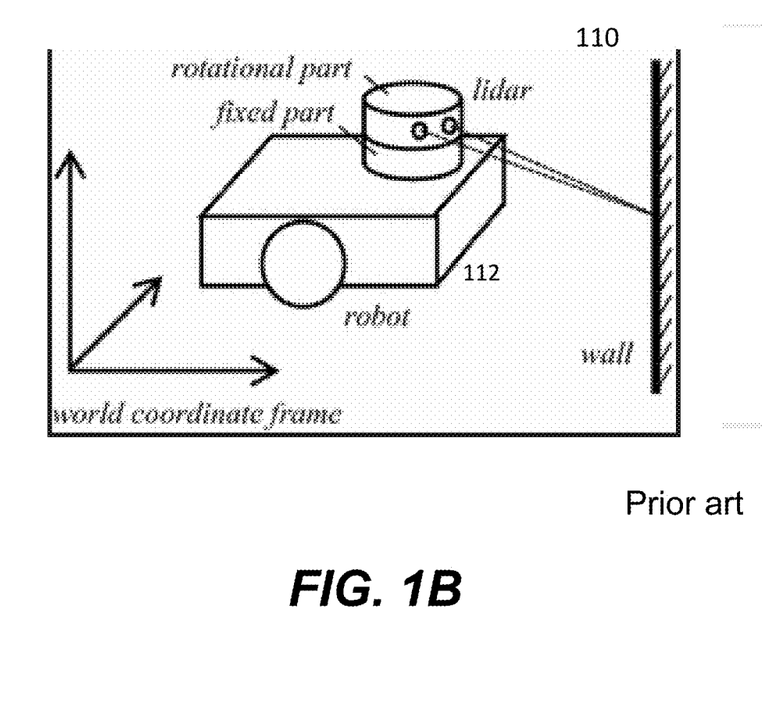
FIG. 1B shows an exemplary environment in which there is a moving object or robot moving around in the environment.
Figure 1C:
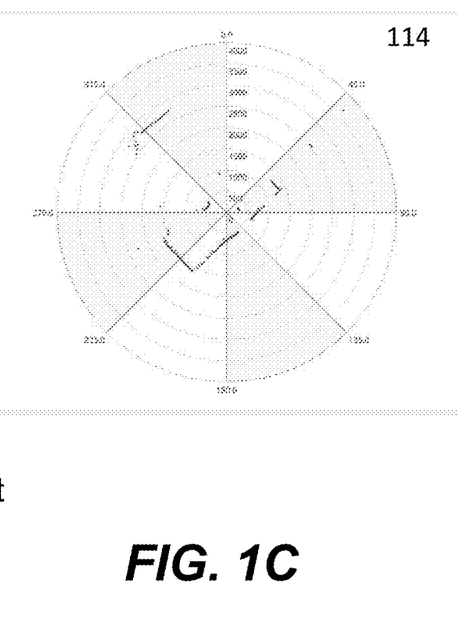
FIG. 1C shows a corresponding map of the ladar to indicate a profile of the surrounding.

FIG. 1B shows an exemplary environment 110 in which there is a moving object or robot 112 moving around in the environment. The robot 112 is equipped with a ladar. The ladar is mounted on the robot 112 and rotates 360 degree in high speed. Thus the ladar can get 2D SLAM (Simultaneous Localization and Mapping) information of the surroundings. FIG. 1C shows a corresponding map of the ladar to indicate a profile of the surrounding. However, there is one obvious problem that comes with the configuration 100 or 110. When there are other light sources in the surrounding, the imager 106 would see multiple lights, all of which (e.g., background, ambient light and sunblind) are referred to as background light interference or suppress the actual dot light the imager 106 is supposed to see. In other words, the imager 106 can see the reflected light dot as well as other unwanted lights. As a result, the signal of the reflected light dot could be buried in the signals of the unwanted lights, causing the distance q wrongly derived.

Figure 1D:
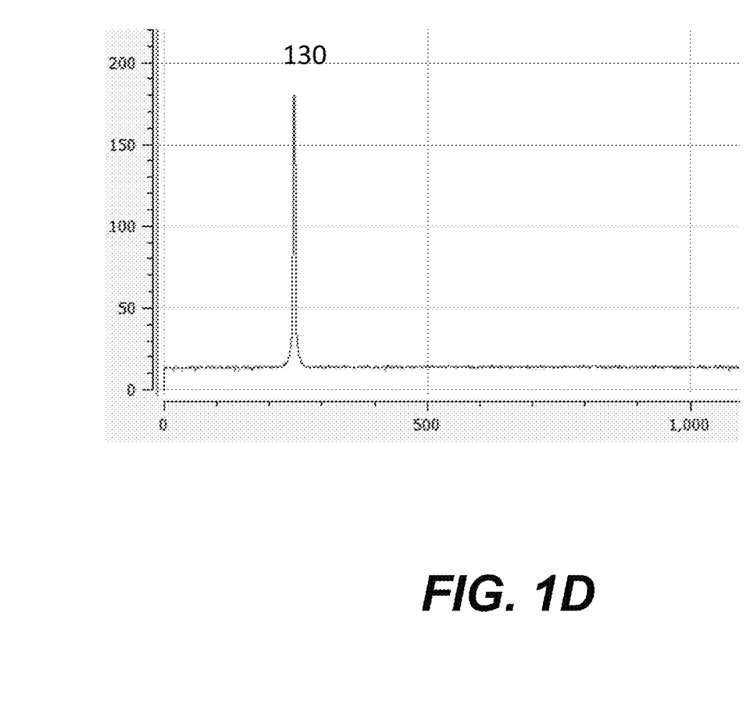
FIG. 1D shows a curve of capturing the actual dot light, where the pulse or signal represents the actual dot light the imager generates.
Figure 1E:
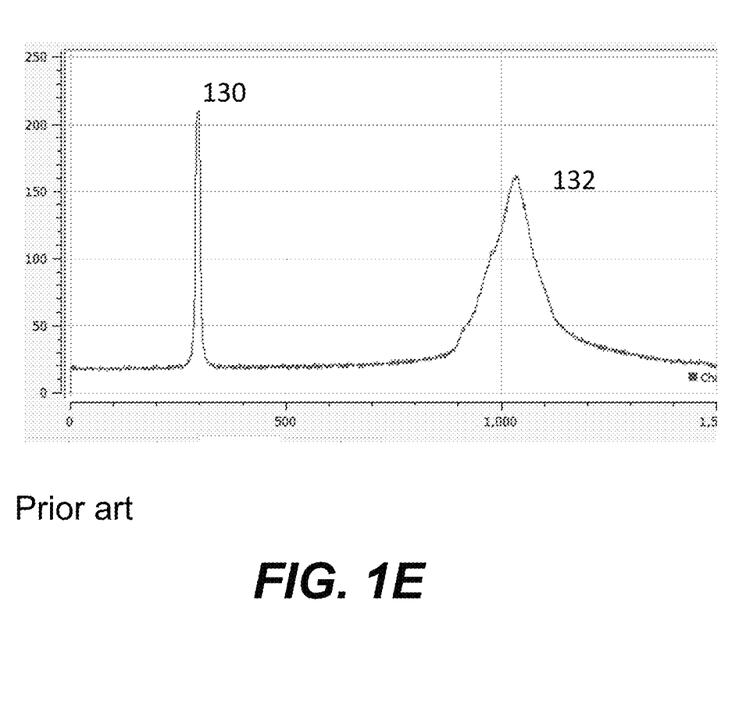
FIG. 1E shows a curve of capturing the actual dot light and background noises when there is background light interference.

FIG. 1D shows a signal capturing the actual dot light, where the pulse or signal 130 represents the actual dot light the imager 106 generates. FIG. 1E shows a corresponding signal capturing the actual dot light and background noises 132 when there is background light interference. It can be appreciated that detection of the pulse 130 in FIG. 1E would be much more difficult than detecting the same in FIG. 1D, prone easily to various errors because of the confusing signals 132 from the background light interference.

Figure 2:
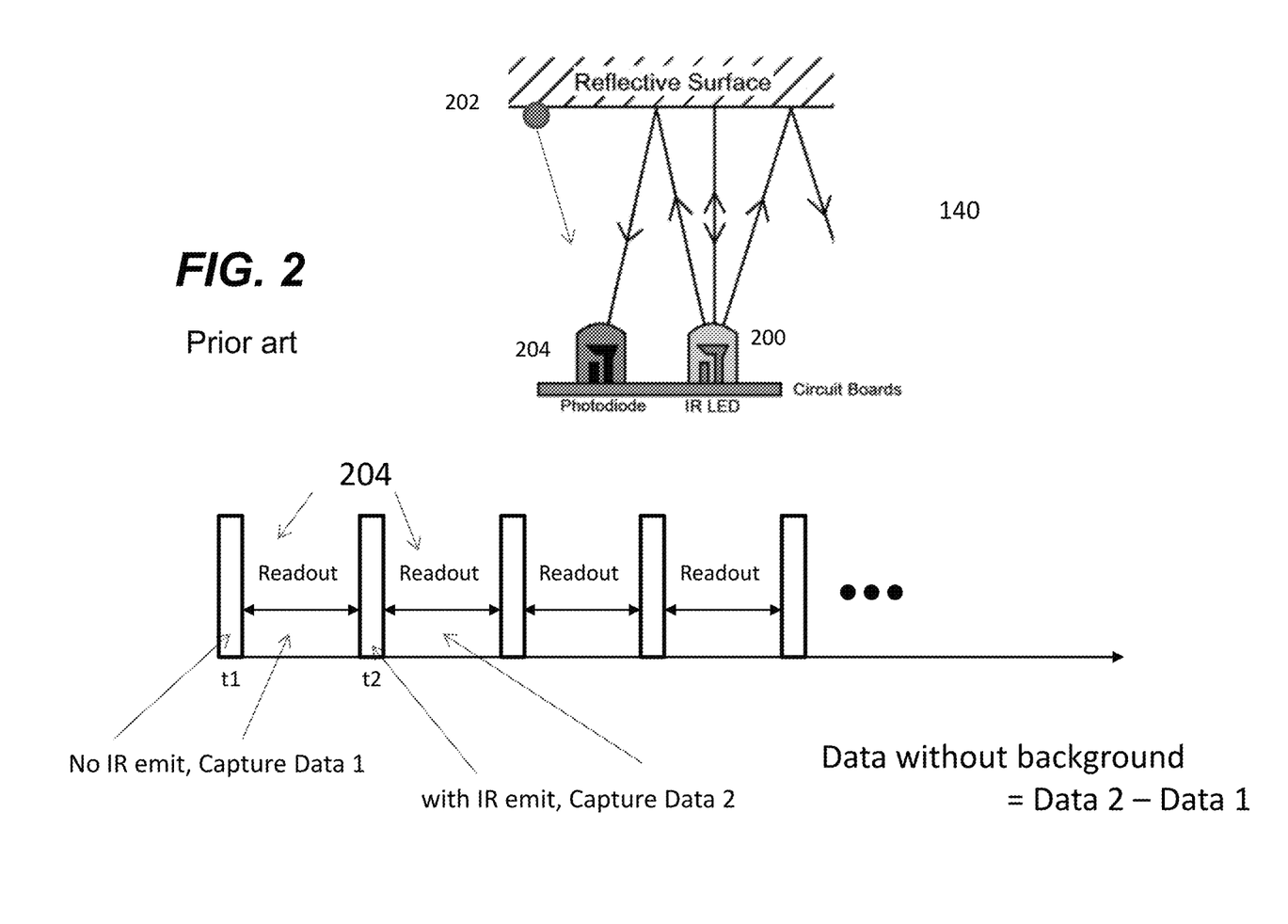
FIG. 2 shows what is being used to overcome the confusing signals from the background light interference.

FIG. 2 shows what is being used to overcome the confusing signals 132 from the background light interference. A light source 200 emits a light at an object 202 in a surrounding with other light sources. As a result, the photodiode produces more than one reflections in the sensor signal it generates. The sensor signal, when readout from the photodiode 204, could be presented in FIG. 1E having multiple pulses or signals and substantially confuse the detection of the distance between the light source 200 and the object 202.

As a practical solution, the photodiode 204 is controlled to capture a scene without the emission of the light from the light source 200. In operation, the photodiode 204 is controlled to sense the scene first at t1 without emitting the light (i.e., the light source 200 is turned off). The data is read out as Data 1 after the first exposure. In a perspective, D1 is an image of the background (light interference) in which there is an object being sensed. At t2, the photodiode 204 is controlled to capture a scene with the emission of the light from the light source 200 (i.e., the light source 200 is turned on). The data is read out as Data 2 after the second exposure. In a perspective, D2 is an image of the background together with the light dot reflected from the object. When the two sets of data are subtracted, Data 2−Data 1, the backgrounds in the two images are cancelled, resulting in an image with only the light dot. However, one issue with this approach is the compromise of the scanning speed of the ladar. As one half of the exposures are devoted to sensing the background, the sensing speed of the photodiode 204 is actually halved. In many high-speed applications, such ladar-based devices would require sensors with double readout rates in order to compensate for the loss of one half of the exposures, potentially increasing the cost of the sensors and complexity of accompanying circuitry.

There is thus a need for a technical solution for overcoming the background light interference without reducing the sensing rate of sensors in ladar applications.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to designs of image sensors and its practical uses. According to one aspect of the present invention, an image sensor is designed to take advantage of the architecture of CMOS sensor with correlated double sampling, or CDS, to avoid the sensing speed being halved as mentioned previously. It is commonly known that a photosensor is read twice (i.e., first and second readouts) in CDS for removing the inherent noises from the photosensor itself. Instead of subtracting a pixel's dark or reference output level from an actual light-induced signal, a background image is managed to be captured before the second readout of the sensor and subtracted from an actual image, where the actual image is defined to include a target. As a result, the readout speed of an image sensor is maintained while the background light interference is removed.

According to another aspect of the present invention, there are two independent storage devices (e.g., capacitors) in the photosensor, each provided to store a charge from an exposure. According to yet another aspect of the present invention, a clock signal circuit is provided to control the first and second readouts of a photosensor sensor. Clock signals are designed to ensure two independent exposures take place successively within one image frame. The two readouts stored in the capacitors from the two independent successive exposures are available from which a final signal is obtained.

The present invention may be implemented in various ways including a method, an apparatus or a system. According to one embodiment, the present invention is an image sensor comprising at least one sensor including a photodiode and producing a final signal within a predefined frame, wherein the final signal captures a reflected light without background light interference. The image sensor further comprises a readout circuit including at least a first storage device and a second storage device, and a clock circuit, coupled to the sensor and the readout circuit, causing the readout circuit to store a first charge and a second charge on the first storage device and the second storage, respectively. The first charge or the second charge is proportional to an intensity of an incoming light impinged upon the photodiode, the first charge and the second charge are created successively within the predefined frame, and the final signal is a subtraction between the first charge and the second charge.

According to another embodiment, the present invention is a method for an image sensor (e.g., CMOS sensor) to produce a final signal, the CMOS including at least one sensor including a photodiode, the method comprising: producing the final signal within a predefined frame, wherein the final signal captures a reflected light without background light interference. The method further comprises storing a first charge and a second charge on a first storage device and a second storage, respectively, wherein the first charge and the second charge, proportional to an intensity of an incoming light impinged upon the photodiode, are generated successively by the photodiode within a predefined frame, the second charge is generated and read into the second storage device while the first charge remains in the first storage device, wherein the final signal is a subtraction between the first charge and the second charge.

Different objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The detailed description of the present invention is presented largely in terms of procedures, steps, logic blocks, processing, or other symbolic representations that directly or indirectly resemble the operations of devices or systems contemplated in the present invention. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Embodiments of the invention are discussed below with reference to FIGS. 3A-6. However, those skilled in the art will readily appreciate that the detailed description given herein with respect to these figures is for explanatory purposes as the invention extends beyond these limited embodiments.

An active-pixel sensor (APS) is an image sensor includes an integrated circuit containing an array of pixel sensors, each pixel containing a photodetector and an active amplifier. There are many types of active pixel sensors including the CMOS APS. Such an image sensor is produced by a CMOS process (and is hence also known as a CMOS sensor), and has emerged as an alternative to charge-coupled device (CCD) image sensors. Depending on an application, the image sensor may be implemented as a linear sensor or an area sensor. To facilitate the description of the present invention, the description herein is largely based on a single photosensor or pixel. Those skilled in the art can appreciate that the description herein is equally applicable to an image sensor employing an array of such photosensors.

Figure 3A:
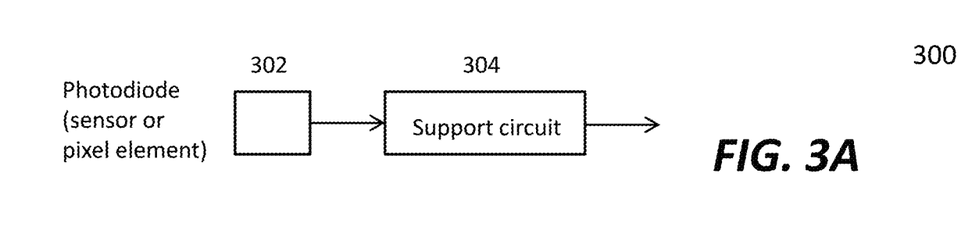
FIG. 3A shows a functional block diagram of a single pixel in an image sensor.
Figure 3B:
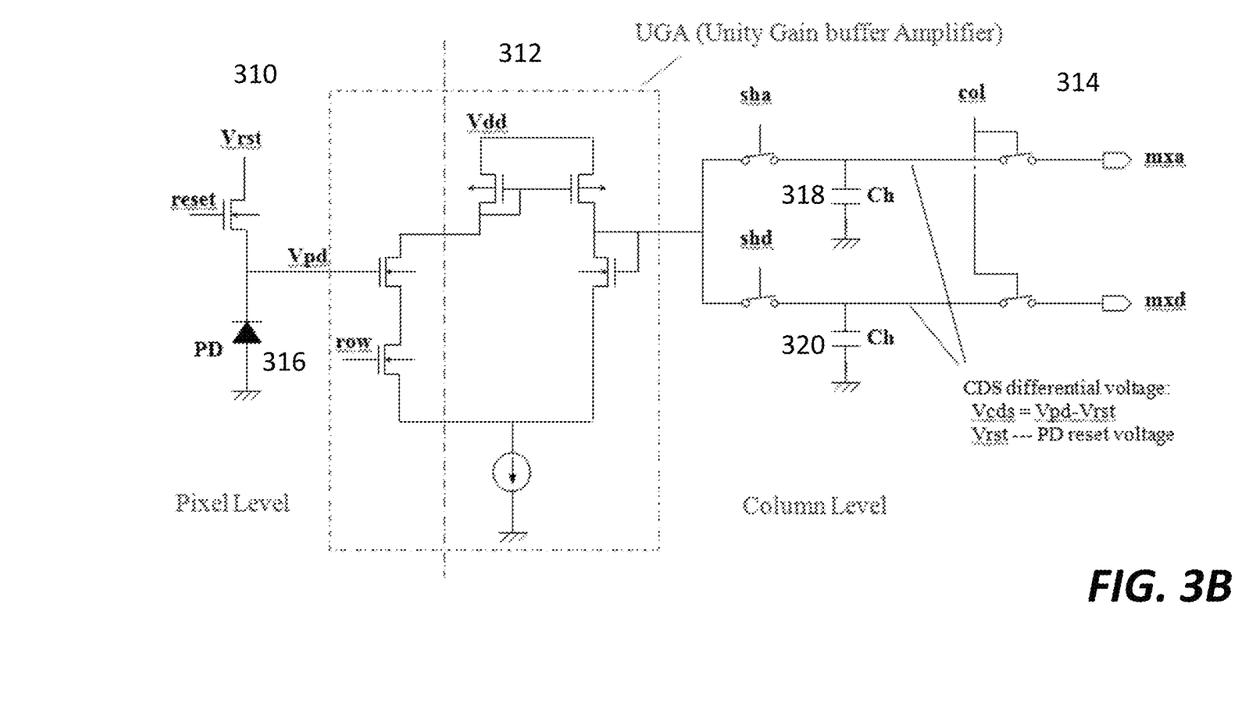
FIG. 3B shows an exemplary design of a sensor or pixel element with an optional amplifier and a readout circuit, where the pixel element further includes a photodiode that is controlled to be turned on or off.

FIG. 3A shows a functional block diagram 300 of a single pixel 302 in an image sensor. When the image sensor (an array of such pixels) is exposed (e.g., via a shutter or circuit control) to a scene, a charge proportional to the incoming light intensity is accumulated in the pixel 302. A supporting circuit 304 is provided to read out the charge. FIG. 3B shows an exemplary design of a photosensor or pixel element 310 with an amplifier 312 and a readout circuit 314. The pixel element 310 further includes a photodiode 316 that is controlled to be turned on or off.

The amplifier 312 is an amplifier provided to amplify the signal produced by the photodiode 316. As an example shown in FIG. 3B, the amplifier 312 is implemented with what is called unity gain buffer amplifier (UGBA). As the name suggests, the amplifier is one that provides electrical impedance transformation from one circuit to another, with the aim of preventing a signal source from being affected by whatever currents or voltages that the load may produce. The readout circuit 314 in FIG. 3B uses an exemplary readout circuit provided to read out the charge accumulated in proportional to the intensity of the light impinged on the diode 316. As an exemplary, the readout circuit 314 is implemented with correlated double sampling (CDS) circuitry to read out the sensing signal from the pixel 310. Another amplifier (not shown) may also be added as a charge integrator to produce a final sensing signal to be coupled for digitization.

The correlated double sampling, or CDS, circuitry is a method employed to improve the signal to noise ratio (S/N) of an image sensor by reading out the pixel 310 twice. The first readout happens right after the exposure of the sensor to a scene. The second readout happens without the sensor is exposed to the scene but soon after the first readout has successfully occurred. Accordingly, the first readout is herein referred to as actual light-induced signal while the second readout is referred to as a reference signal. The reference signal is largely coming from internal dark or reference output level in the pixel. By subtracting the reference output signal from the actual light-induced signal, static fixed pattern noise (FPN) and several types of temporal noise are effectively removed from the output of the sensor. In operation, the first readout of the signal from the photosensor 316 is stored on a capacitor 318 and the second readout the signal from the photosensor 316 is stored on a capacitor 320. The final readout of the signal is the difference between the signals on the capacitors 318 and 320.

Figure 4A:
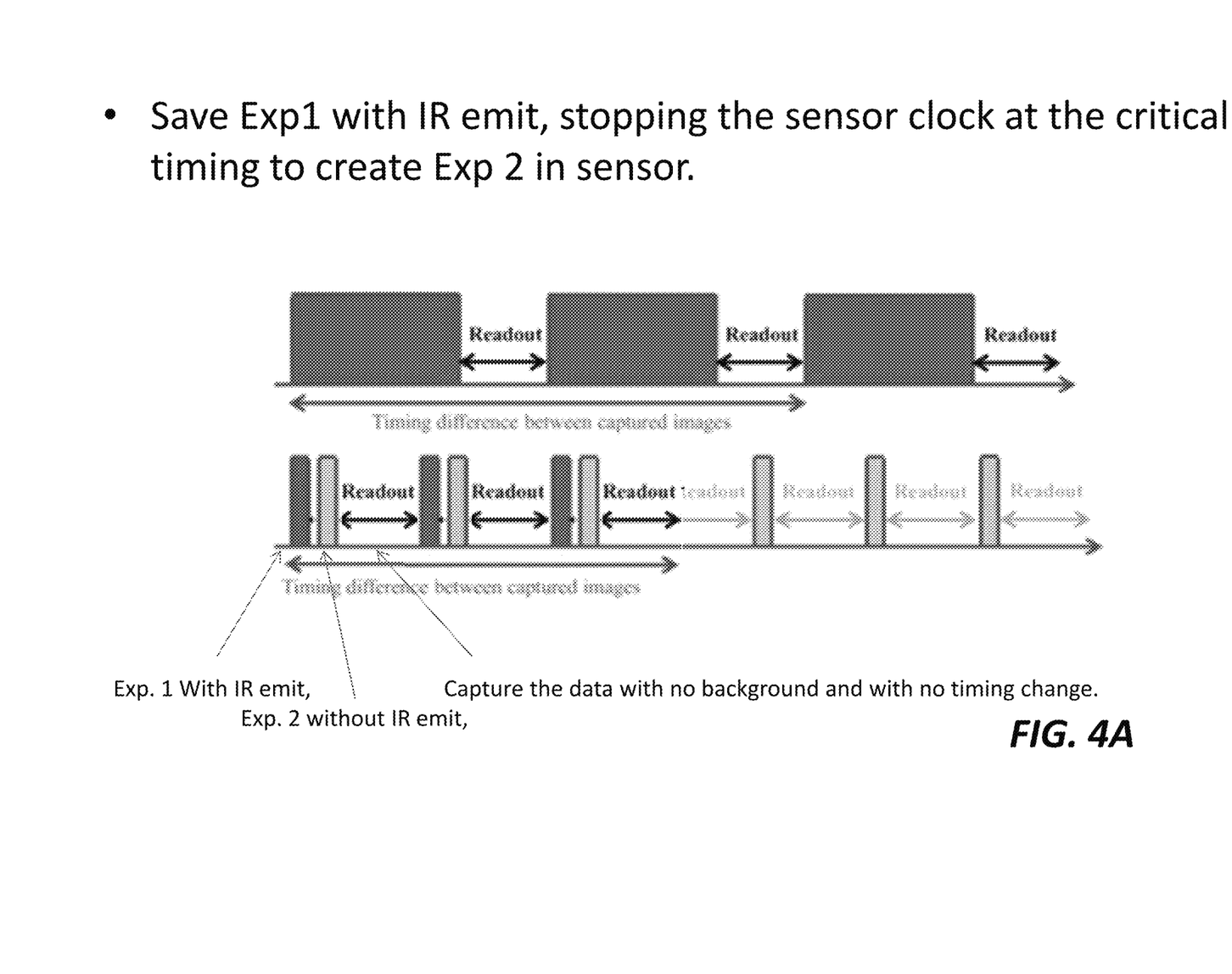
FIG. 4A shows an exemplary operation of reading out the signal from a photodiode, where the signal has the background removed without reducing the sensing cycle originally designed for the image sensor.

Referring now to FIG. 4A, it shows an exemplary operation of reading out a final sensing signal from a photosensor, where the sensing signal has the background removed without reducing the sensing cycle originally designed for an image sensor. Based on the principles of the CDS, according to one embodiment, after the exposure 402 to a scene with an IR light is impinged upon an object, another exposure follows immediately without having the light emitted. The signal from the first exposure is stored on the capacitor 318 of FIG. 3B and the signal from the second exposure is stored on the capacitor 320. The final readout of the signal is the difference between the signals on the capacitors 318 and 320. It can be noticed, compared to the prior art solution, that there is no need to wait for the first exposure to finish (read out) before the second exposure takes place. As a result, a clean image without the background light interference is obtained within one frame of time.

Figure 4B:
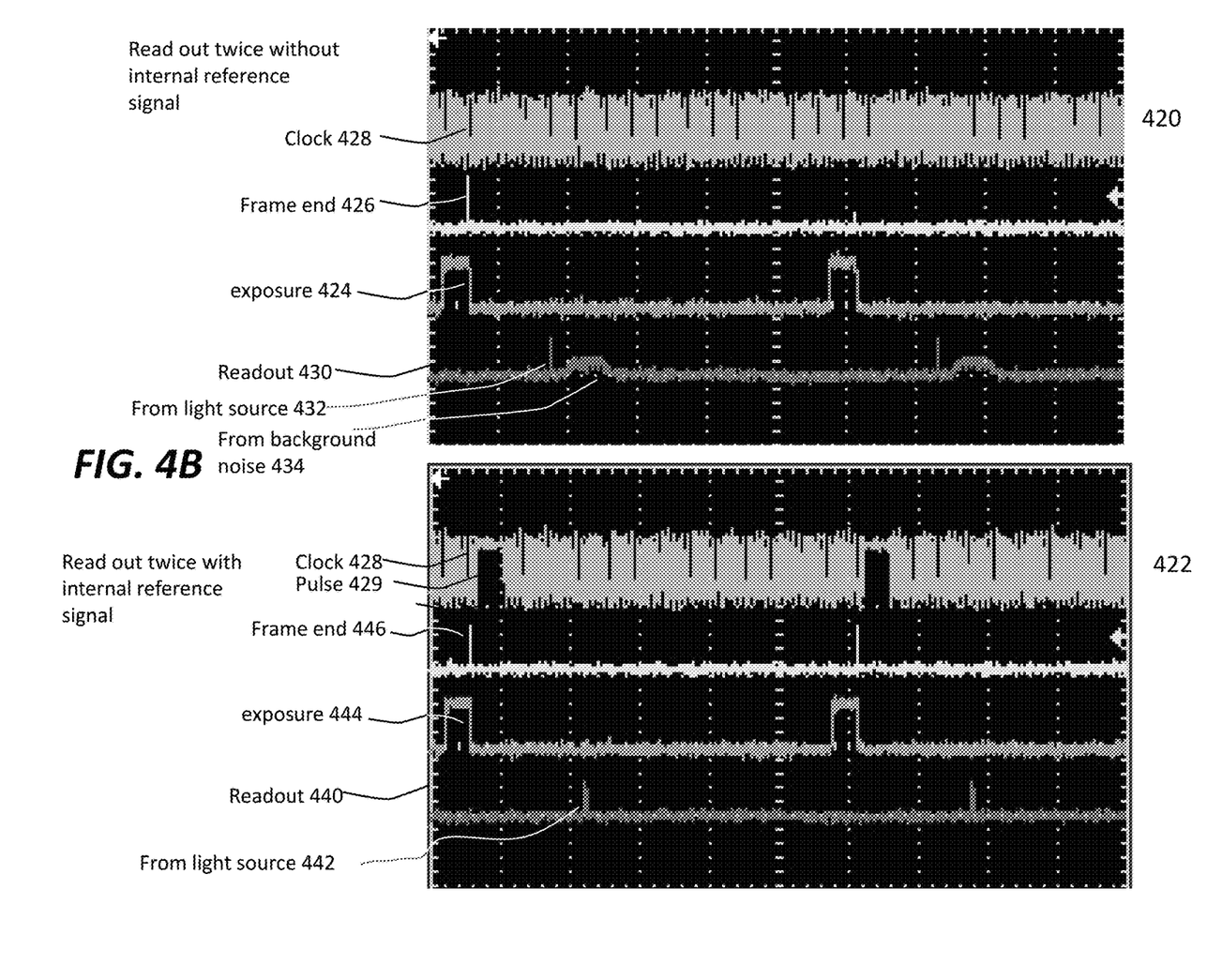
FIG. 4B shows two sets of signals according to one embodiment of the present invention.

FIG. 4B shows two sets of signals 420 and 422 according to one embodiment of the present invention. As an example and a comparison, the signals set 420 are used to read out the signal from a sensor according to the CDS. The curve 424 shows that an exposure is activated. A pulse 426 is provided to signal the end of the exposure and causes a clock signal 428 to start the second readout according to the CDS. In other words, the second readout is based on the internal reference signal from the sensor without having the sensor exposed to the scene. The resulting readout from the sensor is shown as 430 and includes signals 432 pertaining to the background lights besides the signal 434 of the reflected light dot from the emitted light (e.g., visible or invisible laser or infrared) from a light source disposed next to the sensor in a predefined configuration.

The signals set 422 shows the clock signal 428 is modified or redesigned by including a pulse 429 (e.g., the width of pulse may be adjusted to substantially that of the exposure pulse 444) to disable the first readout from the photodiode. Instead, the pulse 429 causes the sensor to be immediately exposed to the scene with the light source turned off. The resultant readout from the sensor is shown as 440 and includes the signal 442 of the reflected light dot from the emitted light (e.g., visible or invisible laser or infrared) from a light source disposed next to the sensor in a predefined configuration.

Figure 5:
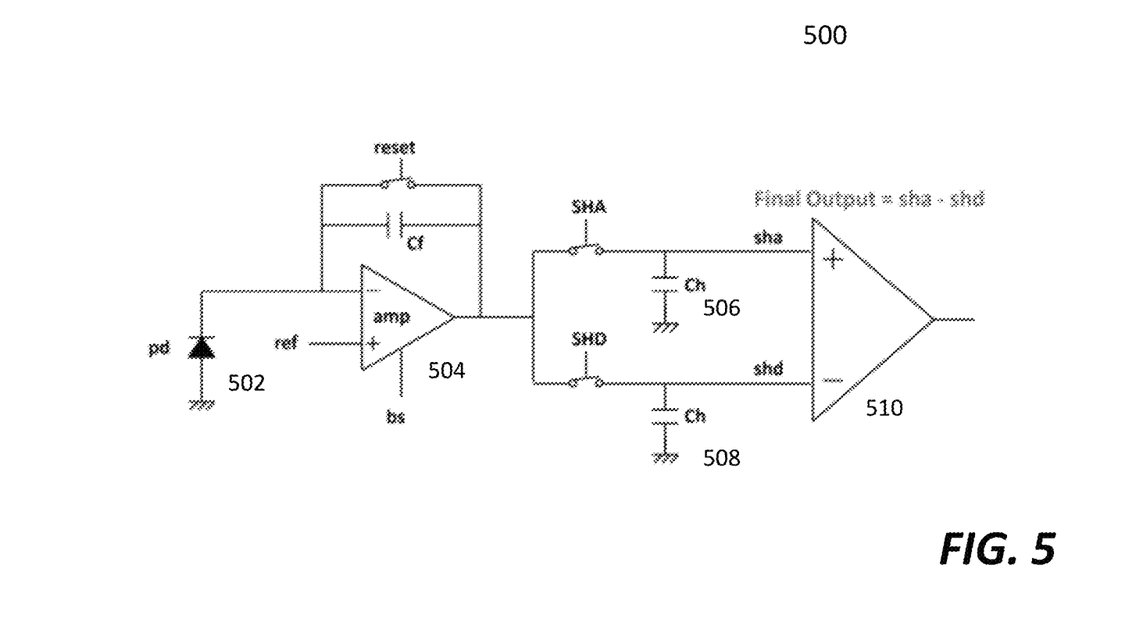
FIG. 5 shows an exemplary circuit according to one embodiment of the present invention.

Referring now to FIG. 5, it shows an exemplary circuit 500 that may be used to implement one embodiment of the present invention with the reference to the clock signals in the signals set 422 of FIG. 4B. The circuit 500 represents one photodiode or photosensor in an image sensor that may be a CMOS-based linear or area sensor. A photodiode 502 is turned on (to be exposed to a scene) and off. Upon a clock signal, the photodiode 502 is turned on for a period in an image frame (e.g., 1/30 second), a first signal is generated by the photodiode 502, where the first signal or intensity thereof is proportional to an intensity of an incoming light impinged upon the photodiode 502. The first signal is then amplified in an amplifier 504. A first readout takes place by charging a storage device (e.g., a capacitor 506) with the amplified signal from the amplifier 504. Immediately right after the first signal is read out onto the capacitor 506 (controlled via a switch SHA by a clock signal), the photodiode 502 is turned on again for a period within the same image frame. A second signal is generated by the photodiode 502, where the second signal or intensity thereof is proportional to an intensity of an incoming light impinged upon the photodiode 502. Similar to the first signal, the second signal is then amplified in the amplifier 504. A second readout (controlled via a switch SHD by a clock signal) takes place by charging another storage device (e.g., a capacitor 508) with the amplified signal from the amplifier 504. The final output (signal) is the subtraction between the two charges on the two different capacitors 506 and 508.

In operation, there are essentially two successive exposures with the photodiode 502. In one embodiment, the first exposure is a scene with a light source turned off. The charge on the capacitor 506 pertains to a background. If there are ambient lights in the background, the charge on the capacitor 506 would capture the ambient lights. The second exposure is a scene with a light source turned on. In other words, an object is being illuminated by a projected light from a light source with a known configuration with respect to the image sensor (e.g., the photodiode 502). The charge on the capacitor 508 pertains to the background as well as the reflection of the light on the object. An adder 510 is provided to perform the subtraction between the two charges on the two different capacitors 506 and 508, namely subtracting the background from the second charge. As a result, the final signal presents a clean reflection of the projected light.

According to one embodiment, the present invention may be realized by a clock signal circuit to control an existing CMOS image sensor, where the clock signal circuit generates one or more signals, at least one of the signals is used to modify the clock signal 428. The modified signal is shown correspondingly in the signal set 422. One of the advantages, benefits and objectives in this implementation is to take advantages of the existing CMOS sensors to realize one embodiment of the present invention.

Figure 6:
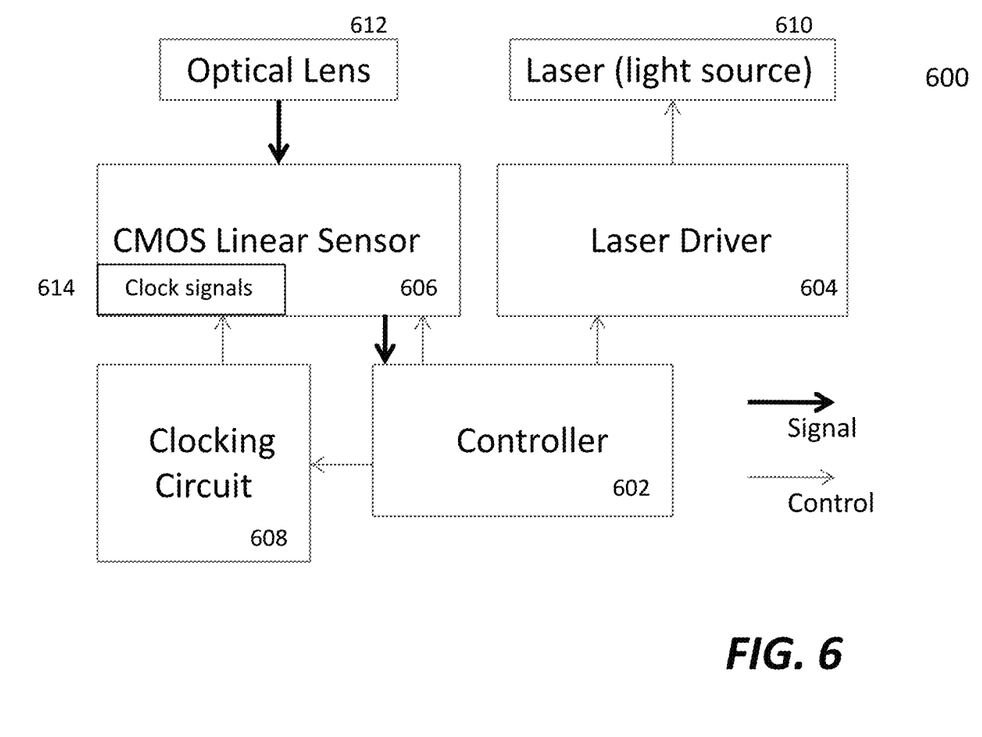
FIG. 6 shows an exemplary system block diagram in which the present invention can be used according to one embodiment of the present invention.

FIG. 6 shows an exemplary system block diagram 600 in which one embodiment of the present invention may be implemented. A controller 602 is provided to synchronize the operations of a laser driver 604, a sensor 606 and a clocking circuit 608. In operation, the controller 602 controls when a light source 610 is turned on or off as well as when a scene is captured by the sensor 606 via a lens. One of the important features, benefits and advantages of the present invention is the use of the clocking circuit 608 to control the clock signals 614. Depending on the implementation, the clock signals 614 may be provided or generated internally or externally for the sensor 606 to operate normally. In the prior art, one of the clock signals 614 (e.g., the clock signal 428 in the signals set 422) is used to generate the internal dark or reference output level. In the embodiment, the clocking circuit 608 generates one or more clock signals to control/modify the clock signals 614. In particular, as shown in FIG. 4A, the clock signal 428 (i.e., one of the clock signals 614) is modified via an output from the clocking circuit 608 to the corresponding clock signal in the signals set 422. In another perspective of the clock signal 428, assuming that a first pulse is used to trigger an exposure and a second pulse is used to generate the internal dark or reference output level, one or more of the clock signals 614 is used to suppress or stop the second pulse and instead cause a second exposure. As a result, there are two charges available in the pixel before a final signal is read out. With this embodiment, the background light interference can be effectively removed without significant changes to the sensor 606.

According to another embodiment, a circuit for generating the clock signals 614 may be simply modified to generate the corresponding clock signal in the signals set 422 to effectively control the operation of the sensor 606, resulting in two successive exposures to cancel the background light interference, wherein charges from the two successive exposures are retained within a pixel before a final readout is obtained from the pixel.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. While the embodiments discussed herein may appear to include some limitations as to the presentation of the information units, in terms of the format and arrangement, the invention has applicability well beyond such embodiment, which can be appreciated by those skilled in the art. Accordingly, the scope of the present invention is defined by the appended claims rather than the forgoing description of embodiments.

I claim:

1. A CMOS sensor comprising a one-dimensional (1D) array of pixels, each of the pixels including one photosensor and producing a final signal within a predefined frame, wherein the final signal captures a reflected light without background light interference;
   a readout circuit including at least a first storage device and a second storage device; and
   a clock circuit, coupled to the 1D array of pixels and the readout circuit, generating a sequence of clocks, each of the clocks defining an image frame and causing the 1D array of pixels to be exposed to a scene being shined by a light dot, wherein the readout circuit stores in first storage a first charge from the 1D array of pixels having exposed to the scene being shined by the light dot, and a pulse is interlaced between two of the clocks to cause the 1D array of pixels to be exposed again to the scene with the light dot off, the readout circuit stores in second storage a second charge, wherein both of the first charge and the second charge are read out simultaneously to produce the final signal per said each of the clocks, and the final signal is a subtraction between the first charge and the second charge in the image frame.

2. The CMOS sensor as recited in claim 1, wherein the reflected light is produced by reflection from an object impinged upon by the light dot emitted from a light source, wherein the light source and the CMOS sensor are disposed in a known configuration.

3. The CMOS sensor recited in claim 2, wherein the object is part of the scene, the pulse is provided separately from the clocks and has a time period related to an exposure time the 1D array of pixels is controlled for.

4. The CMOS sensor recited in claim 2, wherein the object is positioned in a background with other ambient lights, and the first charge pertains to the incoming light with the light source turned on, and the second charge pertains to the incoming light with the light source turned off.

5. The CMOS sensor recited in claim 2, wherein the first charge captures a scene with the light source turned on and the second charge captures the scene with the light source turned off.

6. The CMOS sensor recited in claim 5, wherein the readout circuit includes at least a switch to control which one of the first and second storage devices is used to store the first charge or the second charge, none of the first and second charges is from an internal dark or reference output level in the photosensor.

7. The CMOS sensor recited in claim 6, wherein the second charge is generated while the first charge remains in the first storage device.

8. The CMOS sensor recited in claim 7, wherein the readout circuit is activated to produce the final signal from the first and second charges in the first and second storage devices.

9. The CMOS sensor recited in claim 8, wherein either one of the first and second storage devices is a capacitor.

10. A method for a CMOS sensor to produce a final signal, the CMOS including a one-dimensional (1D) array of pixels, each of the pixels including a photosensor, the method comprising:
    producing the final signal within a predefined frame, wherein the final signal captures a reflected light without background light interference; and
    generating a sequence of clocks, each of the clocks defining an image frame and causing the 1D array of pixels to be exposed to a scene being shined by a light dot;
    storing in a first storage device a first charge proportional to an intensity of the reflected light impinged upon the photosensor;
    interlacing a pulse between two of the clocks to cause the 1D array of pixels to be exposed again to the scene with the light dot off;
    storing in second storage a second charge;
    reading out both of the first charge and the second charge simultaneously to produce the final signal per said each of the clocks, wherein the final signal is a subtraction between the first charge and the second charge in the image frame.

11. The method as recited in claim 10, wherein the pulse has a time period related to an exposure time the 1D array of pixels had for exposing to the scene shined by the light dot, the reflected light is produced by reflection from an object impinged upon by the light dot emitted from a light source, wherein the light source and the CMOS sensor are disposed in a known configuration.

12. The method recited in claim 11, wherein the object is positioned in a background with other ambient lights, and the first charge pertains to the incoming light with the light source turned on, and the second charge pertains to the incoming light with the light source turned off.

13. The method recited in claim 11, wherein the object is positioned in a background with other ambient lights, and the first charge pertains to the incoming light with the light source turned on, and the second charge pertains to the incoming light with the light source turned off.

14. The method recited in claim 11, wherein the first charge captures a scene with the light source turned on and the second charge captures the scene with the light source turned off.

15. The method recited in claim 11, wherein a readout circuit includes at least a switch to control which one of the first and second storage devices is used to store the first charge or the second charge, none of the first and second charges is from an internal dark or reference output level in the photosensor.

16. The method recited in claim 15, wherein the second charge is generated while the first charge remains in the first storage device.

17. The method recited in claim 16, wherein the readout circuit is activated to produce the final signal from the first and second charges in the first and second storage devices.

18. The method recited in claim 17, wherein either one of the first and second storage devices is a capacitor.

19. The method recited in claim 10, further comprising:
producing the pulse outside of the CMOS sensor to modify the clocks signals within the CMOS sensor to cause each of the first and second charges related to an exposure to the scene.

* * * * *